United States Patent
Nee et al.

(10) Patent No.: US 7,733,252 B2
(45) Date of Patent: Jun. 8, 2010

(54) METHOD AND APPARATUS FOR DELAY AND COMBINING CIRCUITRY

(75) Inventors: Chi-Ping Nee, Santee, CA (US); Mike C. Wang, Carlsbad, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 11 days.

(21) Appl. No.: 12/145,133

(22) Filed: Jun. 24, 2008

(65) Prior Publication Data
US 2009/0315747 A1    Dec. 24, 2009

(51) Int. Cl.
*H03M 1/00*    (2006.01)
(52) U.S. Cl. ...................................... 341/122; 341/118
(58) Field of Classification Search .......... 341/122–155
See application file for complete search history.

(56) References Cited

U.S. PATENT DOCUMENTS 5,883,822 A * 3/1999 Le Tourneur et al. ........ 708/313
6,126,602 A * 10/2000 Savord et al. ............... 600/447

* cited by examiner

*Primary Examiner*—Lam T Mai
(74) *Attorney, Agent, or Firm*—Jackson Walker L.L.P.; Christopher J. Rourk

(57) ABSTRACT

A system for signal processing is provided. A sampling delay system generates a plurality of sampling delay values. A plurality of programmable delays each receives one of the sample delay values. A plurality of sample and hold units, each coupled to one of the programmable delays, generates a sample of a received signal in response to an input from the programmable delay.

19 Claims, 4 Drawing Sheets

METHOD AND APPARATUS FOR DELAY AND COMBINING CIRCUITRY

FIELD OF THE INVENTION

The invention relates to sampling of analog signals, and more specifically to a method and apparatus for delay and combining circuitry that utilizes programmable delays for sample and hold systems to sample an analog signal, such as for use in beam forming.

BACKGROUND OF THE INVENTION

Sampling of analog signals to form digital data can be complicated by blocking signals, noise, or other undesired signals in the analog signal. While such signals can be filtered, filtering increases the cost of the analog to digital converter and reduces the strength of a received signal. As a result, it is often necessary to also amplify a signal prior to or after filtering, further increasing the cost of the analog to digital converter.

SUMMARY OF THE INVENTION

The current invention provides a method and apparatus for delay and combining circuitry that allows a signal to be sampled by a plurality of sample and hold circuits, and for the output of the sample and hold circuits to be added so as to effectively amplify the signal.

In accordance with an exemplary embodiment of the present invention, a system for signal processing is provided. A sampling delay system generates a plurality of sampling delay values. A plurality of programmable delays each receive one of the sample delay values. A plurality of sample and hold units, each coupled to one of the programmable delays, generate a sample of a received signal in response to an input from the programmable delay.

Those skilled in the art will further appreciate the advantages and superior features of the invention together with other important aspects thereof on reading the detailed description that follows in conjunction with the drawings.

DETAILED DESCRIPTION OF PREFERRED EMBODIMENTS

Figure 1:
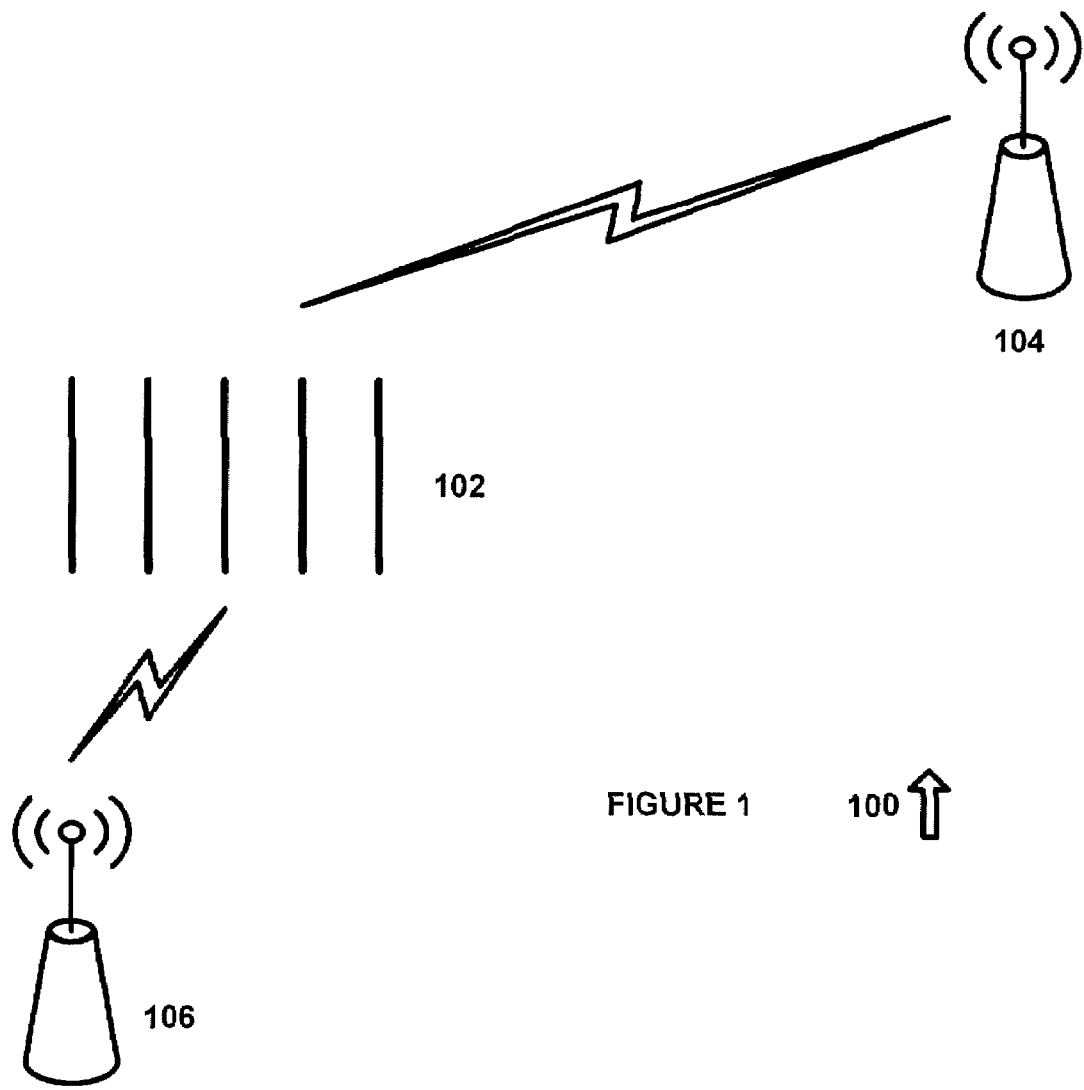
FIG. 1 is a diagram of a system for receiving broadcast channels in accordance with an exemplary embodiment of the present invention.

In the description that follows, like parts are marked throughout the specification and drawings with the same reference numerals, respectively. The drawing figures might not be to scale, and certain components can be shown in generalized or schematic form and identified by commercial designations in the interest of clarity and conciseness.

FIG. 1 is a diagram of a system 100 for receiving broadcast channels in accordance with an exemplary embodiment of the present invention. System 100 includes multiple element antenna 102, which receives broadcast signals from transmitters 104 and 106. Because of the orientation of transmitters 104 and 106 to multiple element antenna 102, it is possible to distinguish the signal received from transmitter 104 at multiple element antenna 102 from the signal received from transmitter 106, even though the signal received from transmitter 106 can be stronger than the signal received from transmitter 104, such as through the use of beam forming. Additional information on the use of beam forming to improve reception is disclosed in U.S. Pat. No. 6,946,993, "Digital broadcasting service receiver for improving reception ability by switched beam-forming," issued Sep. 20, 2005, which is hereby incorporated by reference for all purposes.

In particular, the signal received from transmitter 104 will be received in time sequence at elements A, B, C, D and E, whereas the signal received from transmitter 106 will be received in time sequence at elements E, D, C, B and A. As such, the weaker signal received from transmitter 104 can be distinguished from the stronger signal received from transmitter 106 by sampling the signals on antenna elements A, B, C, D and E at a time when the signal from transmitter 104 is at or near a peak value, and when the signal from transmitter 106 is not at or near a peak value.

In addition, sampled values from multiple element antenna 102 can be added together to effectively amplify the signal received from either transmitter 104 or transmitter 106 without the need for active amplifiers. For example, if a normalized signal magnitude of 0.05 is received at each of the elements of multiple element antenna 102, then those values can be added to produce a normalized signal magnitude of 0.25, assuming that the signals are sampled on each antenna element at the same point on the received waveform. As such, a variable delay value can be used to compensate for any change in the orientation of transmitters 104 or 106 to multiple element antenna 102, as well as to select which of the two signals will be processed.

Figure 2:
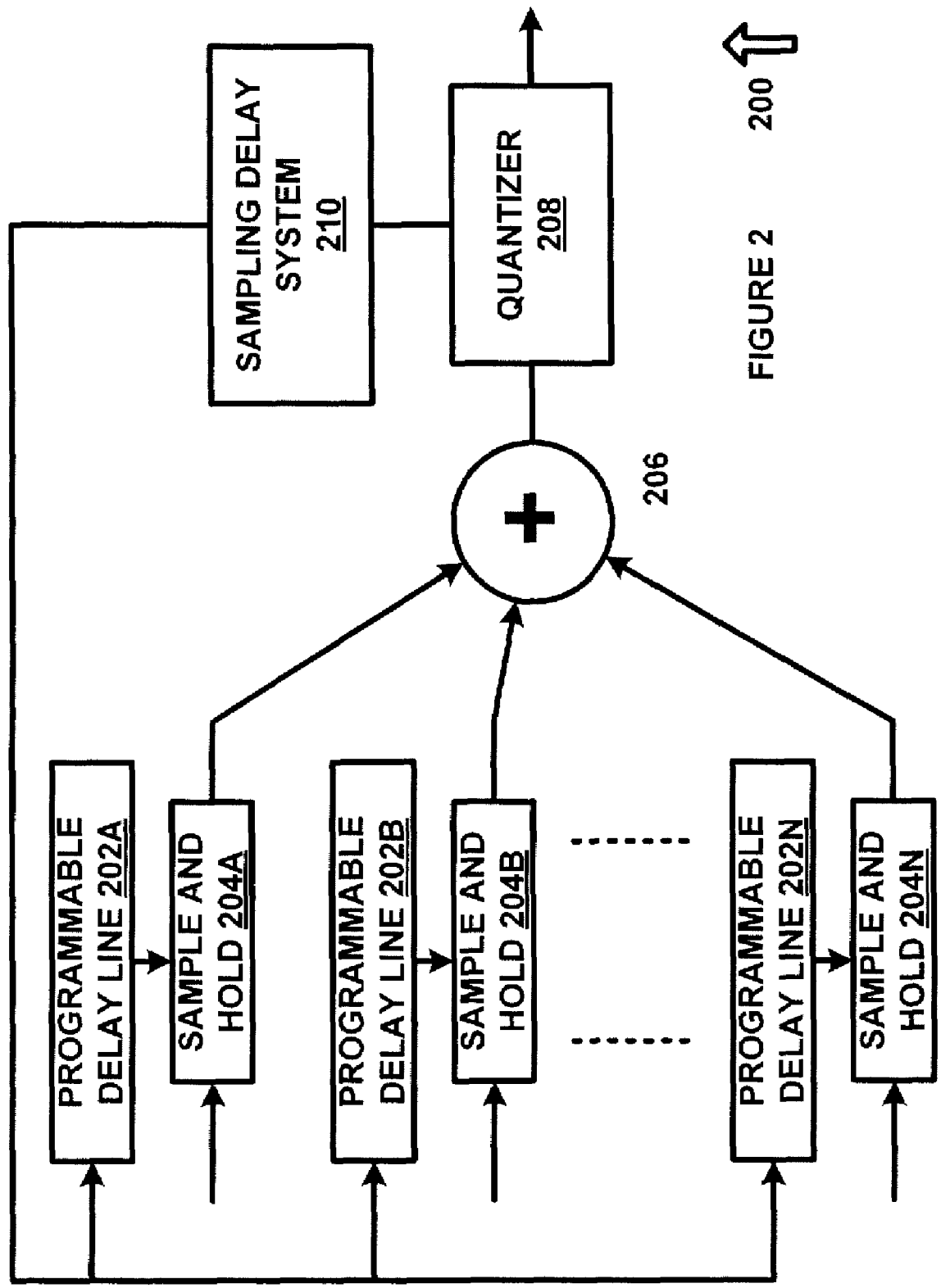
FIG. 2 is a diagram of a system for providing a programmable delay at each of a plurality of sample and hold systems in accordance with an exemplary embodiment of the present invention.

FIG. 2 is a diagram of a system 200 for providing a programmable delay at each of a plurality of sample and hold systems in accordance with an exemplary embodiment of the present invention. System 200 can be implemented in hardware, software, or a suitable combination of hardware and software, and can be one or more integrated devices. As used herein, "hardware" can include a combination of discrete components, an integrated circuit, an application-specific integrated circuit, a field programmable gate array, a digital signal processor, or other suitable hardware. As used herein, "software" can include one or more objects, agents, threads, lines of code, subroutines, separate software applications, two or more lines of code or other suitable software structures operating in two or more software applications or on two or more processors, or other suitable software structures. In one exemplary embodiment, software can include one or more lines of code or other suitable software structures operating in a general purpose software application, such as an operating system, and one or more lines of code or other suitable software structures operating in a specific purpose software application.

System 200 includes a plurality of programmable delay lines 202A through 202N, each of which are coupled to one of a plurality of sample and hold units 204A through 204N. As used herein, the term "coupled" and its cognate terms such as couples' or "couple," can include a physical connection (such as a wire, optical fiber, or a telecommunications medium), a virtual connection (such as through randomly assigned memory locations of a data memory device or a hypertext transfer protocol (HTTP) link), a logical connection (such as through one or more semiconductor devices in an integrated circuit), other suitable connections, or a suitable combination of connections.

Each sample and hold unit 204A through 204N receives a signal, and samples the signal based on a control received from its associated programmable delay line 202A through 202N, such as for use in a beam forming system for improving reception of mobile digital television signals or for other suitable purposes. The outputs of sample and hold unit 204A through 204N are coupled to summer 206, which adds each of the sampled and held values from each of the sample and hold units 204A through 204N. Quantizer 208 is coupled to summer 206 and quantizes the sum of the sampled and held values from sample and hold units 204A through 204N, such as by converting the sum into a binary value. The output of quantizer 208 is then provided to suitable processing circuitry, such as digital signal processing circuitry.

Sampling delay system 210 is coupled to quantizer 208 and each of programmable delay lines 202A through 202N, and provides a programmable delay value to each of programmable delay lines 202A through 202N. In one exemplary embodiment, sampling delay system 210 can generate programmable delay values based on the output of quantizer 208, such as where the delay values are adjusted to optimize the value generated by quantizer 208. In another exemplary embodiment, sampling delay system 210 can receive data from one or more external systems, such as a system that determines a location or orientation of a transmitter relative to a multiple element antenna array where each sample and hold unit 204A through 204N receives a signal from one or more of the elements of the multiple element antenna array, a system that monitors changes in the location or orientation of a transmitter, or other suitable systems.

In operation, system 200 allows a signal to be sampled at different times based on a programmable delay, so as to allow the multiple samples to be added and quantized. In this manner, a signal that is delayed, such as a signal received at different elements of a multiple element antenna array, can be sampled at suitable times to optimize detection of the signal and to minimize the influence of other signals. As such, the sample clock can be delayed instead of the signal, where the signal is delayed by virtue of the transmission environment and other factors. In addition, system 200 effectively amplifies the signal without the need for traditional amplification devices, and allows beam forming to be performed as part of the analog to digital conversion process, instead of as pre- or post-processing to the analog to digital conversion.

Figure 3:
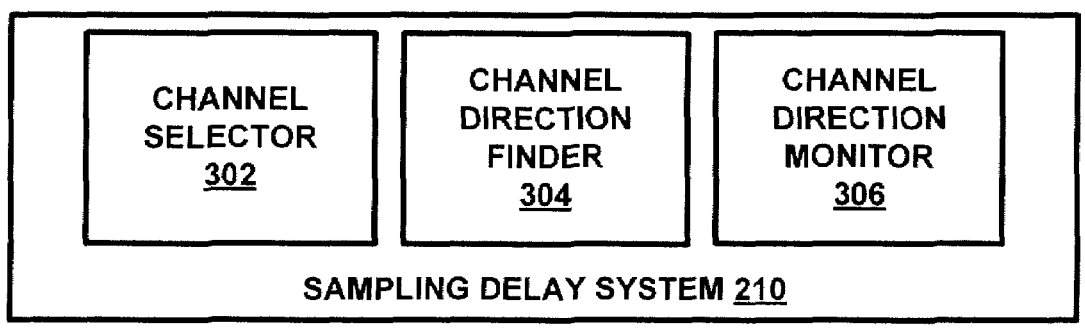
FIG. 3 is a diagram of a system for controlling sampling delay in accordance with an exemplary embodiment of the present invention.

FIG. 3 is a diagram of a system 300 for controlling sampling delay in accordance with an exemplary embodiment of the present invention. System 300 includes sampling delay system 210 and channel selector 302, channel direction finder 304 and channel direction monitor 306, each of which can be implemented in hardware, software or a suitable combination of hardware and software, and which can be one or more integrated devices.

Channel selector 302 receives channel selection data and generates sampling delay data for a plurality of programmable delays based on the channel selection data. In one exemplary embodiment, channel selector 302 can include a look-up table of channel frequencies and can generate sampling delay data based on predetermined frequency characteristics of a channel. In another exemplary embodiment, channel selector can detect available channels, can select a number of delays and associated sample and hold circuits, and can generate sampling delay values dynamically based on selected channels, available channels, number of delays and associated sample and hold circuits, or other suitable variables.

Channel direction finder 304 determines a channel transmitter location relative to an antenna, such as a multiple element antenna array, and generates sampling delay data based on the channel transmitter location. In one exemplary embodiment, channel direction finder 304 receives one or more channel selections and determines a location of a transmitter corresponding to the selected channel, such as by using Doppler principles, a radio direction finder, an automatic direction finder, using Global Positioning System location data of predetermined channel transmitters, a compass or other suitable magnetic field detector, or other suitable methods or systems. Channel direction finder 304 can also utilize signals from a multiple antenna array to determine the presence and location of broadcast signals, such as through the use of filters, tunable circuits, or in other suitable manners.

Channel direction monitor 306 monitors the location of a channel transmitter and generates sampling delay data in response to changes in location. In one exemplary embodiment, channel direction monitor 306 can monitor a location of a transmitter corresponding to a selected channel, such as by using Doppler principles, a radio direction finder, an automatic direction finder, using Global Positioning System location data of predetermined channel transmitters, or other suitable methods or systems. Channel direction monitor 306 can also utilize signals from a multiple antenna array to determine a change in location of broadcast signals, such as by pre- and post-sampling of a selected signal to determine whether a change in channel transmitter location is occurring or in other suitable manners.

In operation, system 300 allows a sampling delay to be determined for a plurality of sample and hold circuits so as to allow a selected channel to be received based on sampling times, such using a multiple element antenna array where the signal from a channel transmitter is received at different times on the different antenna elements. System 300 detects channel transmitter locations, allows channels to be selected, and monitors for changes in channel transmitter location relative to an antenna so as to generate sampling times for programmable delays associated with sample and hold systems.

Figure 4:
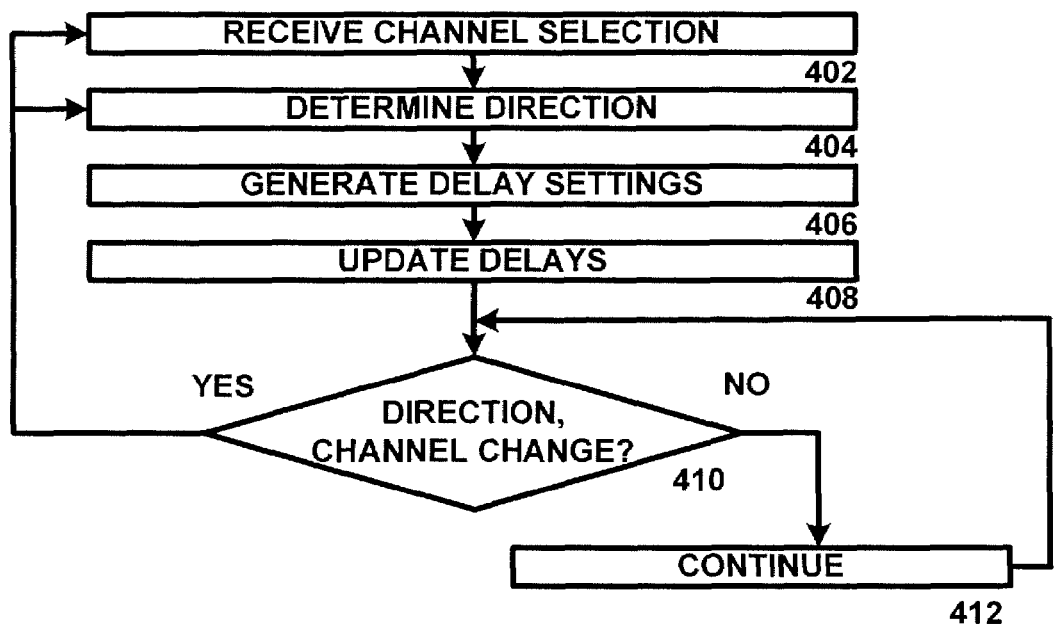
FIG. 4 is a diagram of a method for programming sampling delays in accordance with an exemplary embodiment of the present invention.

FIG. 4 is a diagram of a method 400 for programming sampling delays in accordance with an exemplary embodiment of the present invention. Method 400 begins at 402, where a channel selection is received. In one exemplary embodiment, a channel selection can be received from a user, can be based on predetermined channel selection data, or other suitable channel selection processes can be used. The method then proceeds to 404.

At 404, a channel transmitter direction is determined. In one exemplary embodiment, the location of a channel transmitter relative to a multiple element array can be determined, such as by using Doppler principles, a radio direction finder, an automatic direction finder, using Global Positioning System location data of predetermined channel transmitters, or other suitable processes. The method then proceeds to 406.

At 406, delay settings are generated based on the selected channel, channel location, number of delays and other suitable data. In one exemplary embodiment, the delay settings can be determined based on the geometric relationship between elements of a multiple element antenna array and the location of channel transmitter, such as where the amount of delay of a received signal at different elements can be determined based on the dimensions of the multiple element antenna array and the location of channel transmitter. The method then proceeds to 408.

At 408, delay values are updated at one or more programmable delays. In one exemplary embodiment, programmable delay values can be updated only when they change, can be automatically updated regardless of whether a change has occurred, or other suitable processes can also or alternatively be used. The method then proceeds to 410.

At 410, it is determined whether a new channel has been selected, whether a location of a channel transmitter relative to an antenna has changed, or whether other suitable parameters have changed that require a change in delay settings. If it determined that no parameters have changed, the method proceeds to 412, where the parameters are measured again, and the method returns to 410. Otherwise, the method returns to 402 if a new channel has been selected or to 404 if a change in the channel transmitter location has occurred.

In operation, method 400 allows a sampling delay value to be determined and monitored, such as in a system utilizing a multiple antenna array and associated sample and hold circuits that operate at predetermined sample times. Method 400 allows the sampling delay values to be updated based on changes in location of the channel transmitter location, changes in the selected channel, or other parameter changes.

Figure 5:
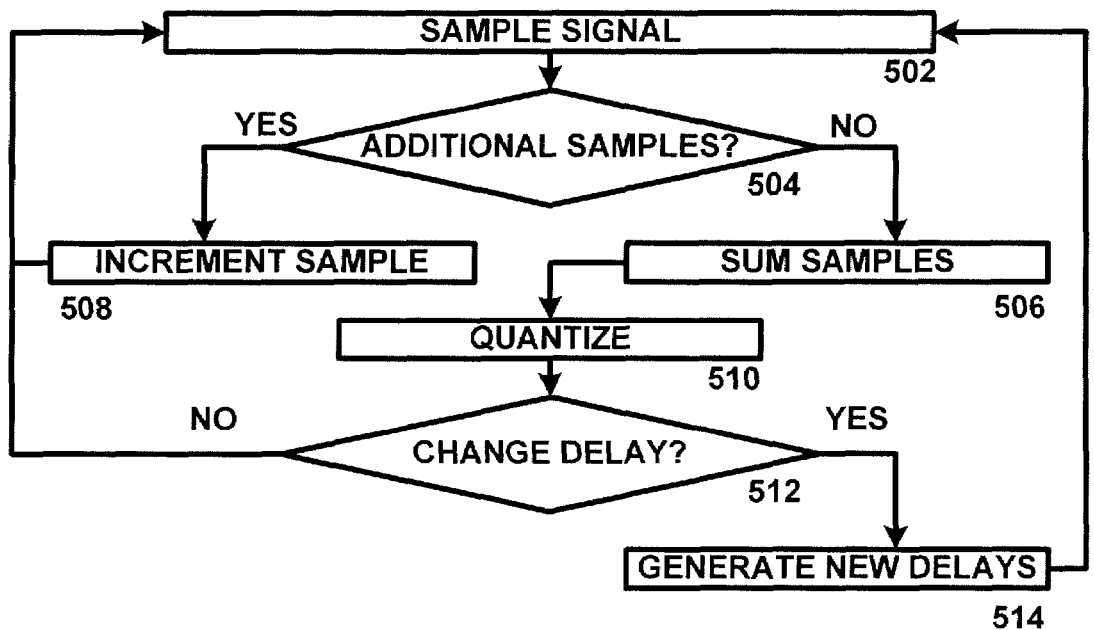
FIG. 5 is a flow chart of a method for sampling a plurality of signal inputs in accordance with an exemplary embodiment of the present invention.

FIG. 5 is a flow chart of a method 500 for sampling a plurality of signal inputs in accordance with an exemplary embodiment of the present invention. Method 500 begins at 502, where a signal is sampled at a sample and hold circuit or other suitable systems or devices. In one exemplary embodiment, the signal can be sampled in response to a programmable delay signal that is generated after a predetermined length of time has elapsed. The method then proceeds to 504.

At 504, it is determined whether additional samples should be generated. In one exemplary embodiment, samples can be generated based on programmable delay values at a plurality of sample and hold circuits, a counter can be used to determine whether additional samples are to be generated, the presence or absence of a data value at each of a number of sample and hold circuits can be determined, or other suitable processes can also or alternatively be used. If it is determined that no additional sample values are to be generated, the method proceeds to 506, otherwise the method proceeds to 508 where the sample is incremented, such as by actuation of a programmable delay or in other suitable manners. The method then returns to 502.

At 506, the samples are summed, such as by reading each sample into a summer, by progressively summing each sample value as it is generated, by storing sample values in predetermined registers of a summer, or in other suitable manners. The method then proceeds to 510 where the sum is quantized, such as by converting the sum into a digital data value or in other suitable manners. The quantized value can be output, stored to a register, or other suitable processes can also or alternatively be performed. The method then proceeds to 512.

At 512, it is determined whether a change in one or more sampling delay values is required. In one exemplary embodiment, a change in sampling delay values can be required due to a change in channel, a change in channel transmitter location, or due to other suitable parameter changes. If it is determined that a change in sampling delay value is required, the method returns to 502, otherwise the method proceeds to 514 where new sampling delay values are generated. The new sampling values can be transmitted to programmable delays or other suitable processes can also or alternatively be performed. The method then returns to 502.

In operation, method 500 allows a plurality of samples of a signal to be generated based on programmable sampling delays, and for the sampled signals to be summed and quantized so as to effectively amplify the selected signal. Method 500 can be used with a multiple element antenna array or other suitable systems where one or more signals are generated and sampled.

Figure 6:
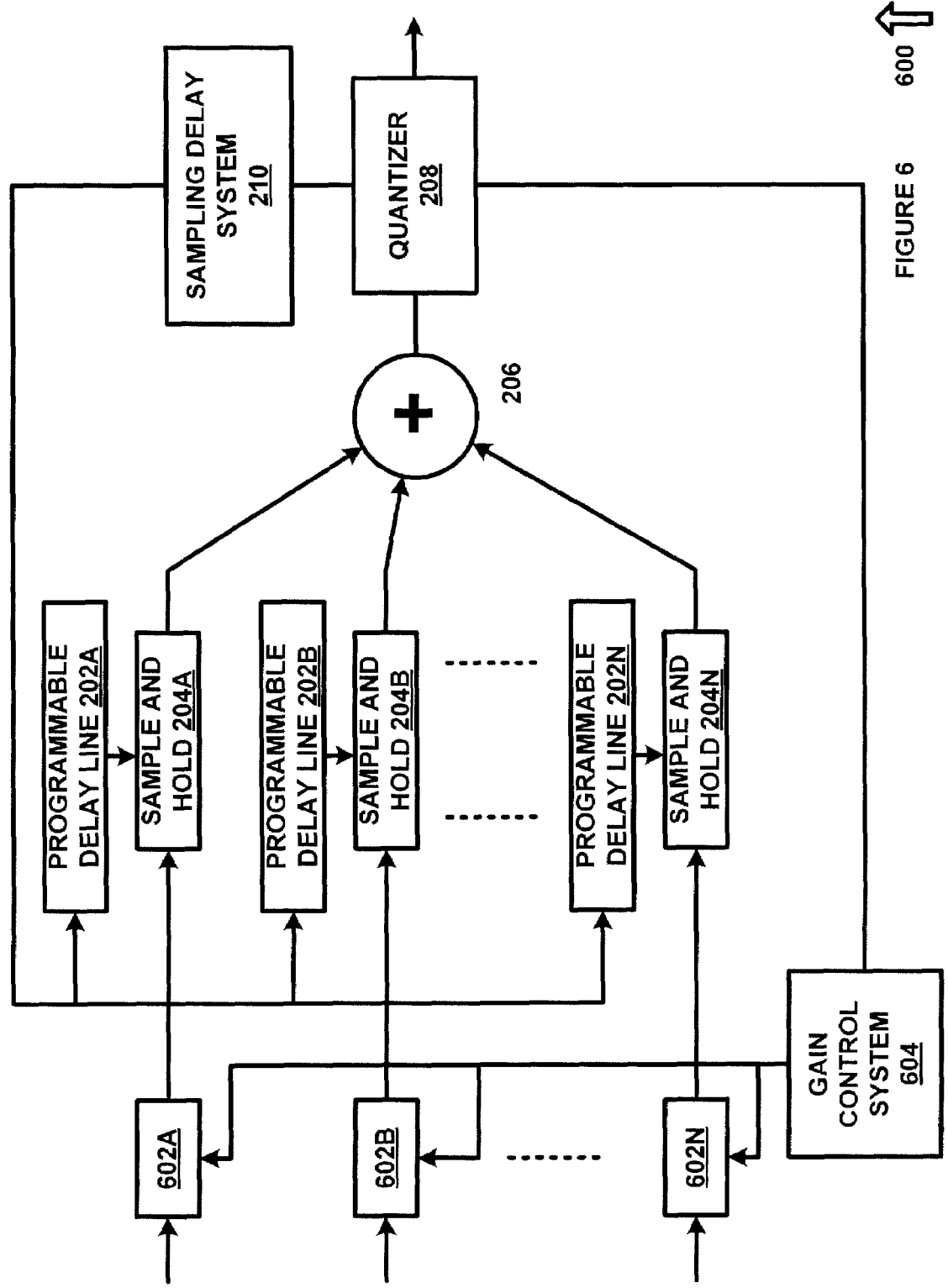
FIG. 6 is a diagram of a system for providing a programmable gain and delay at each of a plurality of sample and hold systems in accordance with an exemplary embodiment of the present invention.

FIG. 6 is a diagram of a system 600 for providing a programmable gain and delay at each of a plurality of sample and hold systems in accordance with an exemplary embodiment of the present invention. System 600 includes exemplary components of system 200 and programmable gain units 602A through 602N, each of which is coupled to gain control system 604. Each programmable gain unit 602A through 602N allows a programmable gain to be provided to each of the signals prior to analog to digital conversion. Quantizer 208 or other suitable controllers can provide control data to gain control system 604 to be used in determining whether to modify any of the programmable gain values provided to programmable gain units 602A through 602N in order to optimize the beam forming capability of system 600.

Although exemplary embodiments of an apparatus of the present invention have been described in detail herein, those skilled in the art will also recognize that various substitutions and modifications can be made to the apparatus without departing from the scope and spirit of the appended claims.

What is claimed is:

1. A system for signal processing comprising:
   a sampling delay system to generate one or more sampling delay values;
   a channel selector to receive channel selection data and generate one or more of the sampling delay values;
   a plurality of programmable delays, each to receive one of the sampling delay values; and
   a plurality of sample and hold units, each coupled to one of the programmable delays, to generate a sample of a received signal in response to an input from the programmable delay.

2. The system of claim 1 further comprising a summer to receive an output from each of the sample and hold units and add the outputs to generate an output.

3. The system of claim 1 further comprising a channel direction finder to determine a location of a communication channel and provide location data to the sampling delay system, wherein the sampling delay system can generate the plurality of sampling delay values based on the location data.

4. The system of claim 2 further comprising a quantizer coupled to the summer to receive the output and to generate a data value based on the output.

5. The system of claim 1 further comprising a channel direction finder for determining an orientation of a channel source relative to an antenna.

6. The system of claim 1 further comprising a channel direction monitor for determining a change in direction of a channel source relative to an antenna.

7. The system of claim 1 wherein the sampling delay system comprises means for generating a plurality of sampling delay values.

8. The system of claim 1 further comprising means for receiving an output from each of the sample and hold units and generating an output.

9. The apparatus of claim 1 further comprising means for determining a location of a communication channel.

10. The apparatus of claim 1 further comprising means for quantizing the output.

11. The apparatus of claim 1 further comprising means for determining a change in direction of a channel source relative to an antenna.

12. A method for processing a signal, comprising:
receiving the signal at each of a plurality of sample and hold units;
sampling the signal at each of the sample and hold units in response to a signal from a programmable delay;
summing the sampled signals to generate an output signal;
determining whether a location of a transmitter has changed relative to a position of an antenna; and
determining a new delay value for the programmable delay if the location of the transmitter has changed.

13. The method of claim 12 further comprising providing a delay value to the programmable delay.

14. The method of claim 12 further comprising:
determining a delay value for the programmable delay; and
providing the delay value to the programmable delay.

15. The method of claim 12 wherein receiving the signal at each of the plurality of sample and hold units comprises receiving the signal from a plurality of antenna elements at each of the plurality of sample and hold units, where each of the plurality of antenna elements is associated with one of the plurality of sample and hold units.

16. The method of claim 12 further comprising quantizing the output signal.

17. The method of claim 12 further comprising:
receiving channel selection data; and
generating a delay value for each of the sample and hold units based on the channel selection data.

18. The method of claim 12 further comprising:
receiving channel selection data; and
monitoring the signal to determine whether a location of a selected channel has changed.

19. A system for signal processing comprising;
a sampling delay system to generate a plurality of sampling delay values;
a channel direction finder to determine a location of a communication channel and provide location data to the sampling delay system, wherein the sampling delay system can generate the plurality of sampling delay values based on the location data;
a plurality of programmable delays, each to receive one of the sampling delay values: and
a plurality of sample and hold units, each coupled to one of the programmable delays, to generate a sample of a received signal in response to an input from the programmable delay.

* * * * *